(12) United States Patent
Halter

(10) Patent No.: US 6,449,329 B1
(45) Date of Patent: Sep. 10, 2002

(54) DUAL-EDGE M/N:D COUNTER

(75) Inventor: Steven J. Halter, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/662,080

(22) Filed: Sep. 14, 2000

(51) Int. Cl.[7] .............................................. H03K 21/08
(52) U.S. Cl. .......................... 377/114; 377/51; 377/107
(58) Field of Search ................................ 377/114, 107, 377/51

(56) References Cited

U.S. PATENT DOCUMENTS

| | | | |
|---|---|---|---|
| 4,761,801 A | * 8/1988 | Underwood | 377/44 |
| 4,856,035 A | * 8/1989 | Lewis | 377/116 |
| 5,023,893 A | * 6/1991 | Leung et al. | 377/117 |
| 5,062,126 A | * 10/1991 | Radys | 377/51 |
| 5,394,106 A | 2/1995 | Black et al. | 327/107 |

* cited by examiner

Primary Examiner—Margaret R. Wambach
(74) Attorney, Agent, or Firm—Philip Wadsworth; Charles D. Brown; Bruce Greenhaus

(57) ABSTRACT

A counter for synthesizing clock signals with minimal jitter. The inventive counter has a first counter stage; a look-ahead circuit input connected to said first counter stage; and a selection circuit for choosing between an output of said first counter stage and an output of said look-ahead circuit as an output of said counter. In the specific embodiment, the first counter stage is adapted to receive a first clock signal having a frequency of N cycles per second and output a second clock signal having a frequency of M cycles per second. The first counter stage includes an accumulator having a rollover point at which an instantaneous count thereof exceeds the value of N−M. The look-ahead circuit determines for a present clock cycle the rollover point for a preceding clock cycle. The look-ahead circuit is a second counter stage adapted to ascertain whether the rising edge or the trailing edge of the second clock signal is closer to the rollover point and output an indication with respect thereto.

34 Claims, 3 Drawing Sheets

DUAL-EDGE M/N:D COUNTER

BACKGROUND OF THE INVENTION

1. Field of the Invention

The present invention relates to digital electronic circuits and systems. More specifically, the present invention relates to counters.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Counters are used in a variety of digital circuits to track events. In addition, counters are used to synthesize clock signals and other waveforms. Generally, a second (lower) clock frequency is synthesized from a first (higher) clock frequency using a counter. Typically, a simple M/N:D type counter is used, where M and N are integers, D is the duty cycle threshold, M is the desired frequency of the synthesized clock signal and N is the frequency of the source or reference clock.

The counter is typically a rising edge counter that counts pulses from the first clock frequency and periodically outputs a pulse at the second clock frequency. That is, the M/N counter outputs M pulses after counting N rising edges pulses of a reference clock.

This is relatively straightforward when the first clock frequency is an integer multiple of the second clock frequency. However, when the first clock is not an integer multiple of the second clock, the task of clock synthesis becomes a bit more challenging. For example, if the reference clock is a 5 megahertz (MHz) clock, and it is necessary to synthesize a 1.5 MHz clock, in accordance with conventional teachings, the M/N counter, programmed to M=3 and N=10, effectively multiplies the reference clock by a 3/10 or outputs three clock pulses for every ten clock pulses of the reference clock. Traditionally, the resolution of a counter is one full clock period. This error, of 200 nanoseconds or one clock period of the 5 MHz reference clock, in the illustration, is known to those skilled in the art as jitter. Clock signals synthesized with conventional M/N:D counters suffer from excessive clock jitter because the conventional M/N:D counter generates an output clock edge from the same point, i.e., the rollover point, in the counter sequence. As a result, output clock jitter will vary from zero to the period of the input reference clock, because the ideal output clock edge will always exist somewhere between the last clock edge of the counter period and the rollover clock edge.

Unfortunately, for certain high precision applications such jitter is unacceptable. One such application is the Universal Serial Bus (USB) application. In this application, jitter is unacceptable as it interferes with a clock recovery operation. Another illustrative application is the analog to digital conversion application. For these and other applications, it is important that the M/N:D counter operate high frequencies. However, as is well known in the art, an M/N:D counter's input clock frequency range directly correlates to the amount of jitter in the output clock.

Thus, there is a need in the art for an improved M/N counter with improved jitter performance.

SUMMARY OF THE INVENTION

The need in the art is addressed by the counter of the present invention. In the illustrative embodiment, the inventive counter includes a first counter stage; a look-ahead circuit input connected to said first counter stage; and a selection circuit for choosing between an output of said first counter stage and an output of said look-ahead circuit as an output of said counter.

In the specific embodiment, the first counter stage is adapted to receive a first clock signal having a frequency of X cycles per second and output a second clock signal having a frequency of $((M/N)*X)$ cycles per second. The first counter stage includes an accumulator having a rollover point at which an instantaneous count thereof exceeds the value of N−M.

The look-ahead circuit predicts, for a present clock cycle, the rollover point for a preceding clock cycle. In the specific illustrative embodiment, the look-ahead circuit is a second counter stage adapted to ascertain whether the rising edge or the trailing edge of the second clock signal is closer to the rollover point and output an indication with respect thereto.

Preferably, the first counter stage is a first M/N counter. In the preferred embodiment, the second counter stage is a second M/N counter preloaded with a value of M. In the illustrative implementation, the second M/N counter includes first and second adders, a multiplexer, and an accumulator. The first adder is adapted to sum the preloaded value of M with an instantaneous output of the accumulator and the second adder is adapted to sum a preloaded value of −(N−M) with an instantaneous output of the accumulator. The outputs of the first and second adders provide first and second inputs to the multiplexer. The preloaded value of M provides a third input to the multiplexer. The most significant bit of the output of the second adder provides a control input to the multiplexer. The output of the multiplexer is input to the accumulator and an output of the accumulator is provided to a comparator. Finally, the comparator outputs a signal indicating whether the output of the accumulator is between M/2 and M.

A circuit for the deglitching the outputs of the first and second stages is disclosed along with an arrangement for providing for backward compatibility with conventional clock synthesizers.

DESCRIPTION OF THE INVENTION

Illustrative embodiments and exemplary applications will now be described with reference to the accompanying drawings to disclose the advantageous teachings of the present invention.

Figure 1:
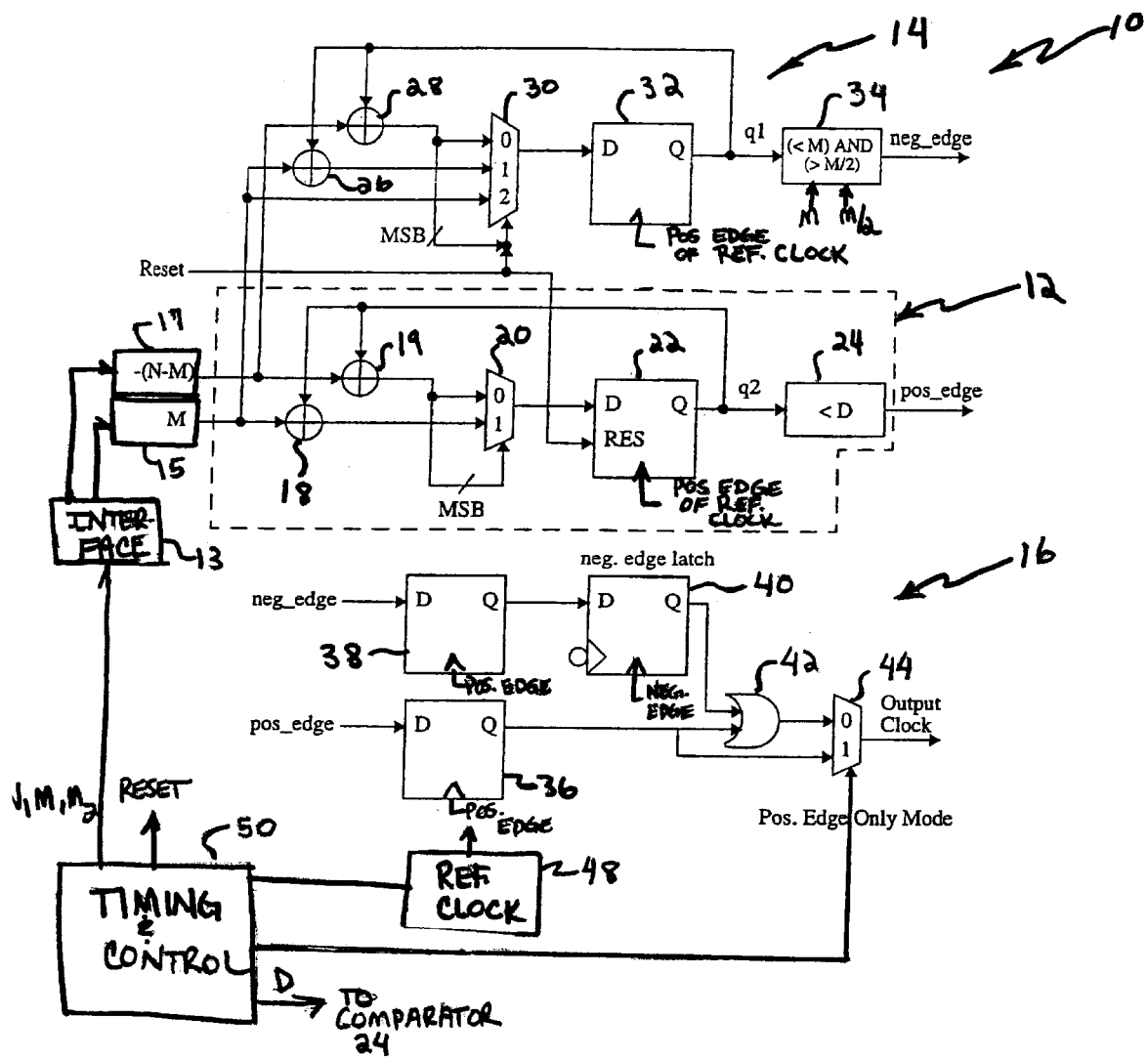
FIG. 1 is a block diagram of an illustrative implementation of the dual-edge M/N counter of the present invention.

FIG. 1 is a block diagram of an illustrative implementation of the dual edge M/N counter of the present invention. The inventive counter 10 includes a first counter stage 12, a second counter stage 14, and a deglitching circuit 16. The first counter stage 12 receives a first count (M) needed to generate a desired synthesized clock frequency from a first shift register 15 and a value (−(N−M)) equal to the opposite of the difference between the frequency of the source or reference clock N and the desired clock frequency M from a second shift register 17. (The inputs M and −(N−M) may be hard coded or provided by other means as will be appreciated by those of ordinary skill in the art.) Inputs to the first and second shift registers 15 and 17, respectively, are provided by an interface 13.

The first counter stage 12 is essentially an M/N counter implemented in accordance with conventional teachings. The first counter stage 12 includes a first adder 18, a second adder 19, a multiplexer 20, a D-Q flip-flop 22, and a comparator 24. The first and second adders 18 and 19 receive a first input from the first and second shift registers 15 and 17, respectively. A second input is provided to the first and second adders 18 and 19 by the flip-flop 22. The outputs of the first and second adders 18 and 19 provide first and second inputs, respectively, to the multiplexer 20. In addition, the most significant bit (MSB) of the output of the second adder 19 provides a control input for the multiplexer 20. As discussed more fully below, when the MSB goes high, it signals the multiplexer 20 to select the output of the second adder 19 instead of the output of the first adder 18.

The output of the multiplexer 20 is connected to the D input of the flip-flop 22. The output of the flip-flop 22 is fed back to the first and second adders 18 and 19, as mentioned above, and to the comparator circuit 24. The comparator circuit 24 compares the output of the flip-flop 22 to a stored duty cycle threshold D and outputs a signal indicating the detection of a positive edge pulse in response thereto. That is, the comparator 24 outputs a positive edge pulse whenever the output of the flip-flop 22 is less than the duty cycle threshold D. When the value of flip-flop 22 is greater than or equal to D, the output transitions to a low state. Note the output has to transition back to low in order to generate another positive edge.

The second counter stage 14 is substantially identical to the first counter stage 12 with two exceptions: 1) the multiplexer 30 in the second counter stage 14 is adapted to select between three inputs instead of two and 2) the comparator 34 of the second counter stage 14 checks to ascertain whether the output of a second flip-flop 32 is greater than M/2 and less than M. The second counter stage 14 includes third and fourth adders 26 and 28, respectively; the multiplexer 30; the second flip-flop 32; and the comparator 34. The third and fourth adders 26 and 28 receive inputs from the first and second shift registers 15 and 17, respectively. A second input to each of the second and third adders is provided by the output of the second flip-flop 32. As per the adders in the first counter stage 12, the outputs of the fourth and third adders 28 and 26, respectively, provide first and second inputs, respectively, to the multiplexer 30.

A third input to the multiplexer 30 is provided by the output of the first shift register 15. This preloads the multiplexer 30 with the desired count (M) of the synthesized clock signal. Note that a reset signal is applied to the first flip-flop 22 of the first counter stage 12 and the multiplexer 30 of the second counter stage 14. The reset signal causes the multiplexer 30 to select the third input thereto (i.e., the output of the first shift register 15). Hence, in the second counter stage 14, the multiplexer 30 sees the value of M one clock cycle before the value of M is seen by the multiplexer 20 in the first counter stage 12.

With the inputs and design of the two counter stages 12 and 14 being otherwise equal, those skilled in the art will appreciate that the pre-loading of the multiplexer 30 allows the second counter stage 14 to act as a look-ahead counter. The second counter stage 14 resets to M and determines the rollover point one cycle early.

The output of the multiplexer 30 is applied to the second flip-flop 32. Those skilled in the art will appreciate that the first and second flip-flops 22 and 32 would, in practice, be banks of flip-flops (or one bit shift registers) of bit width determined by the quantization of value of N. The output of second flip-flop 32 is compared to two thresholds by the second comparator circuit 34. The first threshold is a count of M/2 and the second threshold is a count of M. The second comparator 34 outputs a pulse signaling a detection of a negative edge if the output of the second flip-flop 32 is greater than M/2 and less than M. As discussed more fully below, the comparator 34 indicates whether the negative edge of the synthesized pulse is closer to the rollover point than the leading edge. The rollover point is the point which the counter terminates a preceding count and begins a new count.

As discussed more fully below, in accordance with the present teachings, the rollover point of the counter 14 is employed to ascertain which input reference clock edge is closer to the ideal output clock edge. If the rollover value is less than M/2, then rollover clock edge is closer to the ideal output clock edge. If the rollover value is greater than M/2, the negative clock edge preceding the rollover positive edge is the closer edge. Of course, if the value is exactly equal to M/2, then it is an arbitrary choice. The outputs of the first and second counter stages 12 and 14, respectively, are input to third and fourth flip-flops 36 and 38, respectively, in the deglitching circuit 16. The output of the fourth flip-flop 38 is input to a latch 40. In accordance with the present teachings, the flip-flops, adders and comparators of the first and second counter stages 12 and 14 and the first and second shift registers are clocked with the leading or positive edge of the reference clock 48, the latch 40 is clocked with the trailing or negative edge of the reference clock. Consequently, the latch 40 feeds a 1/2 clock cycle shift to the negative edge signal as will be appreciated by one of ordinary skill in the art. The output of the latch 40 and the output of the third flip-flop 36 are combined by an OR gate 42. The output of the OR gate is the desired synthesized clock signal.

For backward compatibility, the output of the OR gate 42 is provided as a first input to a third multiplexer 44. The second input to the third multiplexer 44 is provided by the output of the third flip-flop 36. Those skilled in the art will appreciate that the OR gate 42 and the third multiplexer 44 cooperate to provide a degree of backward compatibility in that the negative edge detection provided by the second (look-ahead) counter stage 14 and latch 40 are deselected on receipt of a 'Positive Edge Only Mode' signal from a timing and control circuit 50.

The timing and control circuit 50 may be implemented with combinational logic or by other suitable means as will be appreciated by those of ordinary skill in the art.

Figure 2:
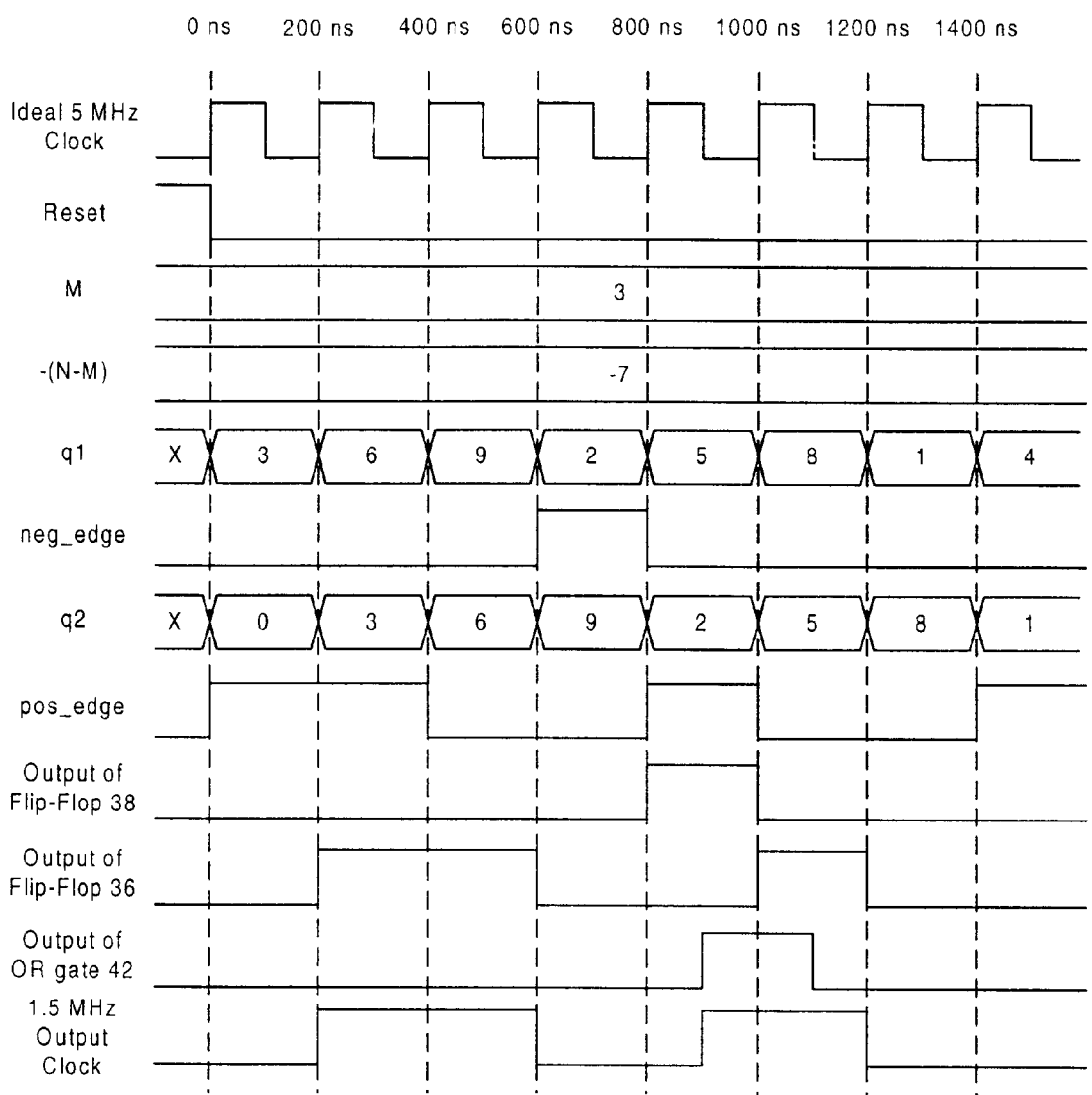
FIG. 2 is a timing diagram illustrative of the operation of the dual-edge M/N counter of the present invention for a 5 MHz·1.5 MHz example.

FIG. 2 is a timing diagram which illustrates the operation of the M/N counter of the present invention. In operation, the initial count (M) is provided to the first and third adders 18 and 26 and second multiplexer 30 and the rollover value −(N−M) is provided to the second and fourth adders 19 and 28 as discussed above. At this point, the outputs (q2 and q1) of the first and second flip-flops 22 and 32 are low. Consequently, the outputs of the second and fourth adders 19 and 28 are low. Accordingly, on the first leading edge of the reference clock 48, the first and second multiplexers 20 and 30 select default inputs. The first multiplexer 20 selects the output of the first adder 18 and the second multiplexer 30 selects the output of the shift register 15. However, the presence of the first adders 18 add a delay of one clock cycle to the receipt of the initial count M by the first multiplexer 20. Accordingly, as mentioned above, the second counter stage 14 is one clock cycle ahead of the first counter stage 12 and acts as look-ahead circuit.

With successive pulses of the reference clock, the initial value of M is ultimately output by the first flipflop 22. The multiplexer 20 performs a signed addition. With each subsequent clock pulse, the initial value of M is incremented by M by the first adder 18. This new value is passed to the flip-flop 22 by the first multiplexer 20 until the output of the flip-flop 22 exceeds (N−M), the rollover point the counter. At this point, the multiplexer 20 outputs a zero to the D input of the flip-flop 22, the output of the first flip-flop 22 returns to zero and the counter 12 begins to count up again. The pulses output by the first flip-flop 22 are passed by the comparator 24 until the duty cycle threshold (D) of the system is reached.

The operation of the second counter stage 14 is identical to that of the first, stage 12 with the exception that it is operating one clock cycle ahead of the first counter stage 12 and the output of the second flip-flop 32 thereof is checked to determine the proximity of the rollover point to the leading-edge of the ideal synthesized clock pulse by the comparator 34 thereof. If the rollover point is between M/2 and M, the comparator 34 outputs a pulse which signals that the negative edge of the reference clock is closer to the ideal edge than the positive edge of the synthesized clock.

Finally, the OR gate 42 in the deglitch circuit 16 outputs a synthesized clock signal comprising the negative edge signal and the positive signal. As mentioned above, clock signals synthesized by conventional M/N:D counters suffer from the excessive clock jitter with respect to their ideal clock frequency due to the fact the circuit always generates the output clock edge off the same point, the rollover point, in the counter sequence. As a result, output clock jitter will vary from zero to the period of the input reference clock, because the ideal output clock edge will always exist somewhere between the last clock edge of the counter period and the rollover clock edge.

In accordance with the present teachings, however, the dual-edge M/N:D counter 10 of the present invention intelligently selects either the rollover clock positive edge or the preceding negative clock edge, depending on which half of the clock period contains the ideal output clock edge. The effect is that the maximum output clock jitter is reduced to one-half a clock period of the input reference clock, assuming the input clock is a 50% duty-cycle clock.

In general, the maximum clock jitter is reduced to the duration of the longest pulse of the clock period. For example, a 100 MHz input clock with a 40% duty cycle would yield a maximum cycle-to-cycle jitter of 6 nanoseconds. The rollover value of the counter indicates which input reference clock edge is closer to the ideal output clock edge. If the rollover value is less than M/2, then rollover clock edge is closer to the ideal output clock edge. If the rollover value is greater than M/2, the negative clock edge preceding the rollover positive edge is the closer edge. Of course, if the value is exactly equal to M/2, then it is an arbitrary choice. The dual-edge M/N:D counter uses a look-ahead circuit which determines the rollover value during the last clock cycle of the counter period. Knowing the rollover value at that point allows the output logic to determine if the negative clock should be used. This is illustrated with respect to the timing diagram of FIG. 2 below.

Figure 3:
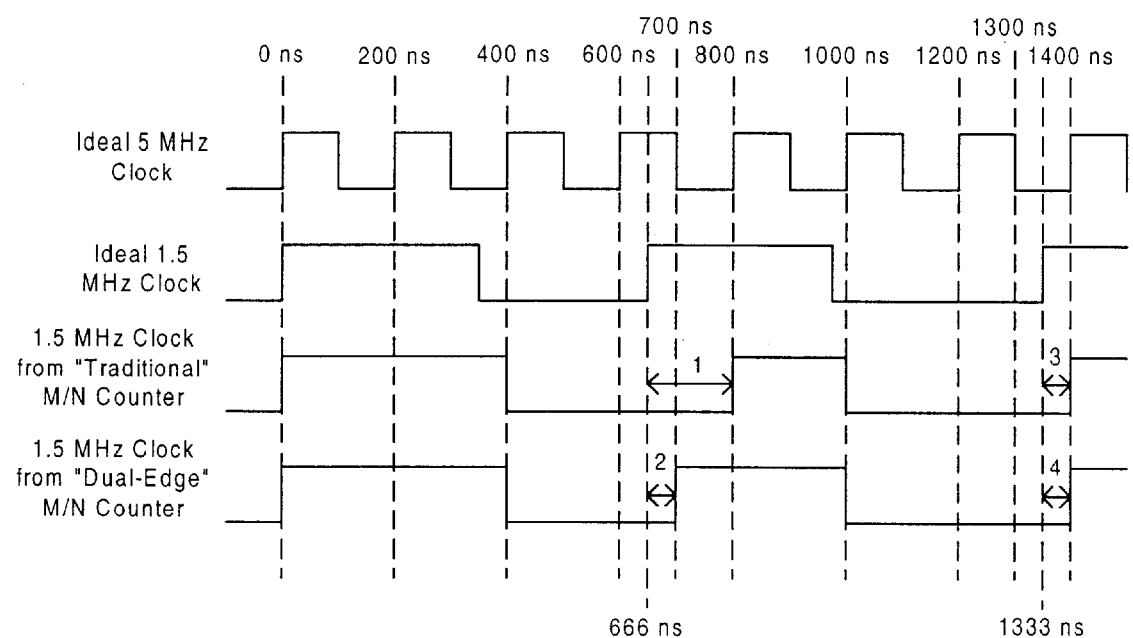
FIG. 3 is a timing diagram illustrative of a performance comparison between a traditional M/N counter and the dual-edge M/N counter of the present invention.

FIG. 3 shows an example of the improved performance of the dual-edge counter of the present invention over a counter implemented in accordance with conventional teachings using the 5 MHz·1.5 MHz example. At points 1 and 2, the traditional M/N counter has a jitter of 134 ns while the dual-edge MN counter of the present invention has a jitter of just 34 ns due to the ideal edge being closer to the positive edge preceding the rollover point (800 ns edge of the 5 MHz reference clock). At points 3 and 4, both counters have equal jitter of 67 ns due to the ideal edge being close to the traditional MN rollover (1400 ns).

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

I claim:

1. A counter comprising:
   first means for receiving a first clock signal having a frequency of N cycles per second and outputting a second clock signal having a frequency of M cycles per second, each cycle having a rising edge and trailing edge, and said first means including an accumulator having a rollover point at which an instantaneous count thereof exceeds the value of N−M;
   second means for ascertaining whether said rising edge or said trailing edge of said second clock signal is closer to said rollover point and outputting an indication with respect thereto; and
   third means for utilizing said indication to provide an output signal.

2. The invention of claim 1 wherein said first means is a first M/N counter.

3. The invention of claim 2 wherein said first M/N counter is an M/N:D counter, where D is a duty cycle threshold.

4. The invention of claim 2 wherein said second means is a look-ahead circuit.

5. The invention of claim 4 wherein said look-ahead circuit determines, for a present clock cycle, the rollover point for a preceding clock cycle.

6. The invention of claim 2 wherein said second means is a second M/N counter.

7. The invention of claim 6 wherein said second M/N counter is preloaded with a value of M.

8. The invention of claim 7 wherein said second M/N counter includes first and second adders, a multiplexer, and an accumulator.

9. The invention of claim 8 wherein said first adder is adapted to sum a preloaded value of M with an instantaneous output of said accumulator and said second adder is adapted to sum a preloaded value of −(N−M) with an instantaneous output of said accumulator.

10. The invention of claim 9 wherein the outputs of said first and second adders provide first and second inputs to said multiplexer.

11. The invention of claim 10 wherein said preloaded value of M provides a third input to said multiplexer.

12. The invention of claim 11 wherein a most significant bit of the output of said second adder provides a control input to said multiplexer.

13. The invention of claim 12 wherein an output of said multiplexer is input to said accumulator.

14. The invention of claim 13 wherein an output of said accumulator is provided to a comparator.

15. The invention of claim 14 wherein said comparator outputs a signal indicating whether or not the output of said accumulator is between M/2 and M.

16. The invention of claim 6 wherein said second M/N counter is a M/N:D counter.

17. The invention of claim 1 further including means for the deglitching the output of said first means and said second means.

18. The invention of claim 1 further including means for making said counter compatible with a conventional counter.

19. A counter comprising: a first counter stage; a look-ahead circuit input connected to said first counter stage; and a selection circuit for choosing between an output of said first counter stage and an output of said look-ahead circuit as an output of said counter and, wherein said first counter stage is adapted to receive a first clock signal having a frequency of N cycles per second and output a second clock signal having a frequency of M cycles per second, each cycle having a rising edge and trailing edge, and said first counter stage includes an accumulator having a rollover point at which an instantaneous count thereof exceeds the value of N−M.

20. The invention of claim 19 wherein said look-ahead circuit is a second counter stage is adapted to ascertain whether said rising edge or said trailing edge of said second clock signal is closer to said rollover point and output an indication with respect thereto.

21. The invention of claim 20 wherein said first counter stage includes a first M/N counter.

22. The invention of claim 21 wherein said first M/N counter is an M/N:D counter.

23. The invention of claim 20 wherein said look-ahead circuit determines for a present clock cycle the rollover point for a preceding clock cycle.

24. The invention of claim 20 wherein said second counter stage is a second M/N counter.

25. The invention of claim 24 wherein said second M/N counter is preloaded with a value of M.

26. The invention of claim 25 wherein said second M/N counter includes first and second adders, a multiplexer, and an accumulator.

27. The invention of claim 26 wherein said first adder is adapted to sum a preloaded value of M with an instantaneous output of said accumulator and said second adder is adapted to sum a preloaded value of −(N−M) with an instantaneous output of said accumulator.

28. The invention of claim 27 wherein the outputs of said first and second adders provide first and second inputs to said multiplexer.

29. The invention of claim 28 wherein said preloaded value of M provides a third input to said multiplexer.

30. The invention of claim 29 wherein a most significant bit of the output of said second adder provides a control input to said multiplexer.

31. The invention of claim 30 wherein an output of said multiplexer is input to said accumulator.

32. The invention of claim 31 wherein an output of said accumulator is provided to a comparator.

33. The invention of claim 32 wherein said comparator outputs a signal indicating whether or not the output of said accumulator is between M/2 and M.

34. A method for synthesizing a clock signal including the steps of:

receiving a first clock signal having a frequency of N cycles per second and outputting a second clock signal having a frequency of M cycles per second, each cycle having a rising edge and trailing edge, using an accumulator having a rollover point at which an instantaneous count thereof exceeds the value of N−M;

ascertaining whether said rising edge or said trailing edge of said second clock signal is closer to said rollover point and outputting an indication with respect thereto; and utilizing said indication to provide an output signal.

* * * * *